US011823920B2

(12) United States Patent
Choi et al.

(10) Patent No.: US 11,823,920 B2
(45) Date of Patent: Nov. 21, 2023

(54) APPARATUS FOR ATTACHING SEMICONDUCTOR PARTS (71) Applicant: JMJ Korea Co., Ltd., Bucheon-si (KR)

(72) Inventors: Yun Hwa Choi, Bucheon-si (KR); Jung Min Park, Bucheon-si (KR)

(73) Assignee: JMJ Korea Co., Ltd., Bucheon-si (KR)

(*) Notice: Subject to any disclaimer, the term of this patent is extended or adjusted under 35 U.S.C. 154(b) by 573 days.

(21) Appl. No.: 17/124,475

(22) Filed: Dec. 16, 2020

(65) Prior Publication Data

US 2021/0320019 A1 Oct. 14, 2021

(30) Foreign Application Priority Data

Apr. 13, 2020 (KR) .................. 10-2020-0044531

(51) Int. Cl.
*H01L 21/67* (2006.01)
*B22F 7/06* (2006.01)
(Continued)

(52) U.S. Cl.
CPC ........ *H01L 21/67144* (2013.01); *B22F 7/064* (2013.01); *B23K 1/0016* (2013.01);
(Continued)

(58) Field of Classification Search
CPC ......... H01L 21/67144; H01L 21/67034; H01L 21/67333; H01L 21/67754; H01L 21/681;
(Continued)

(56) References Cited

U.S. PATENT DOCUMENTS

2003/0137080 A1* 7/2003 Bouras .................. B05C 11/101
264/272.17
2006/0266792 A1* 11/2006 Ko ........................ B23K 37/047
257/E21.705
(Continued)

FOREIGN PATENT DOCUMENTS

CN 102184874 B * 12/2012 ........... H01L 24/743

OTHER PUBLICATIONS

Translation of CN-102184874-B, Dec. 2012, He Y (Year: 2012).*

*Primary Examiner* — George R Koch
(74) *Attorney, Agent, or Firm* — Park, Kim & Suh, LLC (57) ABSTRACT

Provided is an apparatus for attaching semiconductor parts. The apparatus includes a substrate loading unit, at least one semiconductor part loader, a first vision examination unit, at least one semiconductor part picker, at least one adhesive hardening unit, and a substrate unloading unit, wherein the substrate loading unit supplies a substrate on which semiconductor units are arranged, the at least one semiconductor part loader supplies semiconductor parts, the first vision examination unit examines arrangement states of the semiconductor units, the at least one semiconductor part picker mounts semiconductor parts in the semiconductor units, the at least one adhesive hardening unit hardens and attaches adhesives interposed between the semiconductor units and the semiconductor parts, and the substrate unloading unit releases the substrate on which semiconductor parts are mounted. The adhesive hardening units restrictively transmit a heat source only to at least one semiconductor unit, which is to be hardened.

18 Claims, 12 Drawing Sheets

(51) Int. Cl.
*B23K 1/00* (2006.01)
*B23K 1/005* (2006.01)
*B23K 1/012* (2006.01)
*B23K 3/06* (2006.01)
*B23K 37/04* (2006.01)
*H01L 21/673* (2006.01)
*H01L 21/677* (2006.01)
*H01L 21/68* (2006.01)
*B23K 103/12* (2006.01)
*B23K 101/40* (2006.01)

(52) U.S. Cl.
CPC ............ *B23K 1/0056* (2013.01); *B23K 1/012* (2013.01); *B23K 3/0607* (2013.01); *B23K 37/04* (2013.01); *H01L 21/67034* (2013.01); *H01L 21/67333* (2013.01); *H01L 21/67754* (2013.01); *H01L 21/681* (2013.01); *B22F 2301/10* (2013.01); *B22F 2301/255* (2013.01); *B23K 2101/40* (2018.08); *B23K 2103/12* (2018.08)

(58) Field of Classification Search
CPC .. B22F 7/06; B22F 2301/10; B22F 2301/255; B23K 1/0016; B23K 1/0056; B23K 1/012; B23K 3/0607; B23K 37/04; B23K 2103/12; B23K 2101/40
See application file for complete search history.

(56) References Cited

U.S. PATENT DOCUMENTS

2016/0081241 A1\* 3/2016 Seyama .................. H05K 3/30
                                                        29/832
2019/0333792 A1\* 10/2019 Ikeda ..................... B23K 1/008

\* cited by examiner

APPARATUS FOR ATTACHING SEMICONDUCTOR PARTS

CROSS-REFERENCE TO RELATED PATENT APPLICATION

This application claims the benefit of Korean Patent Application No. 10-2020-0044531, filed on Apr. 13, 2020, in the Korean Intellectual Property Office, the disclosure of which is incorporated herein in its entirety by reference.

BACKGROUND OF THE INVENTION

1. Field of the Invention

The present invention relates to an apparatus for attaching semiconductor parts in which properties of a product may be less affected by a heat source transmitted while semiconductor units are separately hardened and semiconductor equipment is in-lined so as to continuously connect to equipment used in following processes.

2. Description of the Related Art

In general, a clip mount apparatus manufactures a semiconductor by using sintering or soldering which needs a heat source for attaching a semiconductor chip to a clip.

In this regard, a multiple clip mount apparatus cuts a plurality of clips all at once, includes the cut clips in a lead frame on which a conductive adhesive is dotted, and performs sintering or soldering in a reflow furnace at once.

For example, semiconductor packages are mass-produced in such a way that a whole substrate, on which a semiconductor chip and a clip are attached, is inserted into an oven or a reflow furnace and heat is applied to the reflow furnace to harden an adhesive. Such way may be easy for mass-production, however, heat at the same temperature is applied to all semiconductor parts and thereby, temperature of parts or substrate, which do not need that temperature, increases together so that properties of the product may be adversely affected.

Also, when soldering is performed by using a general oven or a general reflow furnace, a solder is melted as water and thus, may be hardly identified to the naked eye. However, the melted solder flows at random in a range of 20 μm to 30 μm and is hardened at a specific flowing position. Accordingly, even if the clip is mounted at a right position, the melted solder reflows during a reflow process and thus, an alignment error of about 50 μm needs to be considered in a general reflow process.

An area, where clip is mounted and soldered, that is, a metal pad on a semiconductor chip, includes a mount tolerance of about 50 μm. When a metal pad is small and one clip is mounted, the clip may be attached by recognizing using a vision examination. However, when a plurality of clips is simultaneously mounted, a semiconductor chip itself may not be already aligned right at the center during a prior process, which is a semiconductor chip mount process, and thereby, is mounted having a mount tolerance. Consequently, when a metal pad is small, the clip may be out of the metal pad even if the clip is accurately mounted.

Accordingly, unlike a general method of simultaneously heating and hardening the whole substrate by using an oven or a reflow furnace and applying heat at the same temperature to all semiconductor parts, a method of hardening a specific semiconductor unit restrictively or separately is required to minimize property changes occurring due to a heat source in semiconductor parts or parts of a substrate, which do not need a heat source.

SUMMARY OF THE INVENTION

The present invention provides an apparatus for attaching semiconductor parts in which properties of a product may be less affected by a heat source transmitted while semiconductor units are separately hardened and semiconductor equipment is in-lined so as to continuously connect to equipment used in following processes.

According to an aspect of the present invention, there is provided an apparatus for attaching semiconductor parts for performing electrical connection of a semiconductor package, the apparatus including: a substrate loading unit for supplying a substrate, on which at least one semiconductor unit used to manufacture at least one semiconductor package, is arranged; at least one semiconductor part loader for supplying semiconductor parts; a first vision examination unit for examining any one of arrangement states of the semiconductor units, adhesive applied positions, and whether to apply adhesives on the substrate; at least one semiconductor part picker for transferring the semiconductor parts to the substrate and mounting the transferred semiconductor parts in the semiconductor units; at least one adhesive hardening unit for hardening and attaching adhesives interposed between the semiconductor units and the semiconductor parts; and a substrate unloading unit for releasing the substrate on which the semiconductor parts are hardened by the adhesives and mounted in the semiconductor units, wherein the adhesive hardening unit restrictively transmits a heat source only to at least one semiconductor unit, which is to be hardened, so that a temperature difference occurs between the semiconductor units, to which the heat source is supplied, and the semiconductor units, to which the heat source is not supplied, on the substrate.

The apparatus may further include at least one adhesive applying unit for supplying the adhesives used to attach the semiconductor parts to the semiconductor units.

The substrate may include Cu of above 60%.

The substrate may include an insulator.

The substrate may be used for an enclosed semiconductor package.

The semiconductor part loader may supply a semiconductor chip.

The semiconductor chip may include any one from IGBT, diode, MOSFET, a GaN device, and a SiC device.

The semiconductor part loader may supply a metal clip for electrically connecting to the semiconductor chip.

The adhesive applying unit may supply the adhesives to the semiconductor units by dotting using a needle or by spraying from the upper parts of the semiconductor units.

The adhesives may be solder alloys.

The adhesives may be sinter materials comprising Ag or Cu.

The solder alloys may be in a paste form where a size of solder particles included therein may be 25 μm or below.

The solder alloys may include Au and Sn mixed in a predetermined ratio.

The semiconductor part pickers may supply a heat source at above 60° C.

The adhesive hardening unit may mount the semiconductor parts on the upper parts of the adhesives by the semiconductor part pickers and harden the adhesives at the same time.

The adhesive hardening unit may mount the semiconductor parts on the upper parts of the adhesives by the semiconductor part pickers and then, harden the adhesives.

The adhesive hardening unit may harden the adhesives by soldering or sintering.

The adhesive hardening unit may harden the adhesives by laser heating.

The adhesive hardening unit may harden the adhesives by directly contacting the semiconductor units using a heater.

The adhesive hardening unit may harden the adhesives by indirectly contacting the semiconductor units using hot air.

The hot air may have temperature in the range of 50° C. through 450° C. and may include nitrogen or hydrogen of predetermined ratio (%).

The adhesive hardening unit may sequentially harden the adhesives of each semiconductor unit on the substrate.

The adhesive hardening unit may sequentially harden the adhesives of each semiconductor unit block including at least two semiconductor units on the substrate.

The adhesive hardening unit may sequentially harden the adhesives of each of the at least two semiconductor unit blocks.

The adhesive hardening unit may sequentially harden the adhesives of each group of the semiconductor units grouped and arranged by at least one row and column on the substrate.

The semiconductor parts may be attached by providing the substrate by the substrate loading unit, mounting the semiconductor parts in the semiconductor units by using the semiconductor part picker, hardening the adhesives interposed between the semiconductor units and the semiconductor parts by using the adhesive hardening unit, and releasing the substrate, on which the semiconductor parts are attached to the semiconductor units, by using the substrate unloading unit.

The semiconductor parts may be attached by providing the substrate by the substrate loading unit, mounting first semiconductor parts in the semiconductor units by using the semiconductor part picker, mounting second semiconductor parts in the semiconductor units by using the semiconductor part picker, hardening the adhesives interposed between the semiconductor units and the first semiconductor parts and between the first semiconductor parts and the second semiconductor parts by using the adhesive hardening unit, and releasing the substrate, on which the first and second semiconductor parts are stacked and attached to the semiconductor units, by using the substrate unloading unit.

The semiconductor parts may be attached by providing the substrate by the substrate loading unit, mounting first semiconductor parts in the semiconductor units by using the semiconductor part picker, firstly hardening the adhesives interposed between the semiconductor units and the first semiconductor parts by using the adhesive hardening unit, mounting second semiconductor parts in the semiconductor units by using the semiconductor part picker, secondly hardening the adhesives interposed between the first semiconductor parts and the second semiconductor parts by using the adhesive hardening unit, and releasing the substrate, on which the first and second semiconductor parts are stacked and attached to the semiconductor units, by using the substrate unloading unit.

The semiconductor parts may be the semiconductor chips or the metal clips.

The semiconductor part loader may further include semiconductor parts arrangement buffers, and the semiconductor part picker may transfer the semiconductor parts, which are transferred from the semiconductor part loader to the semiconductor parts arrangement buffers, to the semiconductor units.

The apparatus may further include a second vision examination unit for examining attachment positions of the semiconductor parts in the semiconductor units.

The apparatus may further include a plasma cleaning unit for plasma cleaning the substrate, on which the semiconductor parts are hardened by the adhesives and mounted in the semiconductor units, and transferring the substrate to the substrate unloading unit.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereinafter, the present invention will be described in more detail with reference to the accompanying drawings to be easily implemented by those of ordinary skill in the art. This invention may be embodied in many alternate forms and should not be construed as limited to only the exemplary embodiments set forth herein.

An apparatus for attaching semiconductor parts according to an embodiment of the present invention includes a substrate loading unit 110, at least one semiconductor part loader, a first vision examination unit 130, at least one semiconductor part picker, at least one adhesive hardening unit 150, and a substrate unloading unit 160, wherein the substrate loading unit 110 supplies a substrate 10 on which semiconductor units 11 are arranged, the at least one semiconductor part loader supplies semiconductor parts, the first vision examination unit 130 examines arrangement states of the semiconductor units 11, the at least one semiconductor part picker mounts semiconductor parts in the semiconductor units 11, the at least one adhesive hardening unit 150 hardens and attaches adhesives interposed between the semiconductor units 11 and the semiconductor parts, and the substrate unloading unit 160 releases the substrate 10 on which semiconductor parts are mounted. The adhesive hardening units 150 restrictively transmit a heat source only to at least one semiconductor unit 11, which is to be hardened, so that a temperature difference occurs between the semiconductor units 11, to which a heat source is supplied, and the semiconductor units 11, to which a heat source is not supplied, on the substrate 10 and thereby, properties of a product may be less affected by a heat source transmitted while semiconductor units 11 are hardened.

Hereinafter, the composition of the apparatus for attaching semiconductor parts performing electrical connection of a semiconductor package will be described in detail below with reference to FIGS. 1 through 12.

Firstly, the substrate loading unit 110 transfers and supplies the substrate 10 including at least one semiconductor units 11 arranged thereon by which at least one semiconductor package may be manufactured, to the first vision examination unit 130.

Figure 3:
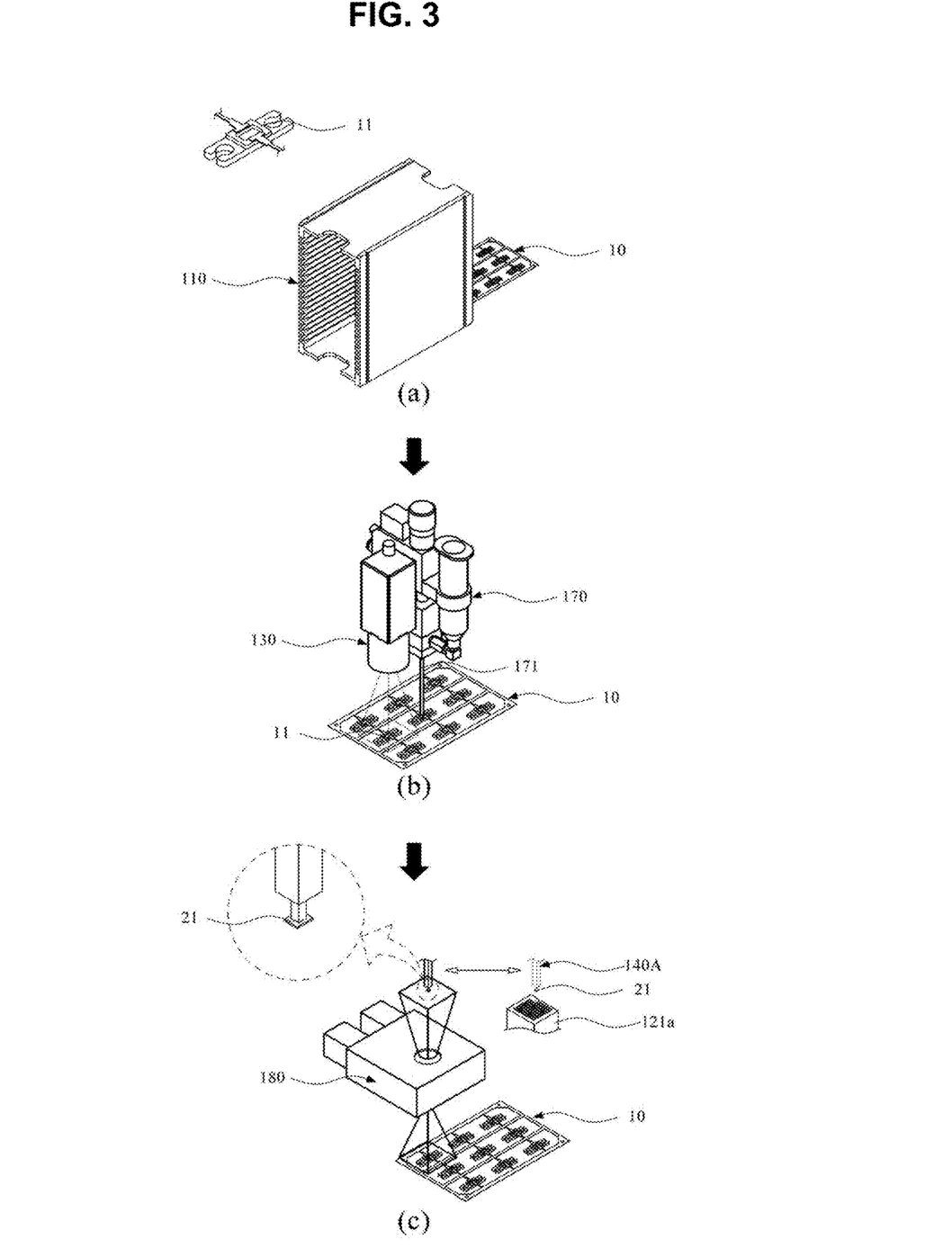
FIGS. 3 and 4 are exploded views illustrating process orders of the apparatus for attaching semiconductor parts of FIG. 1.
Figure 6:
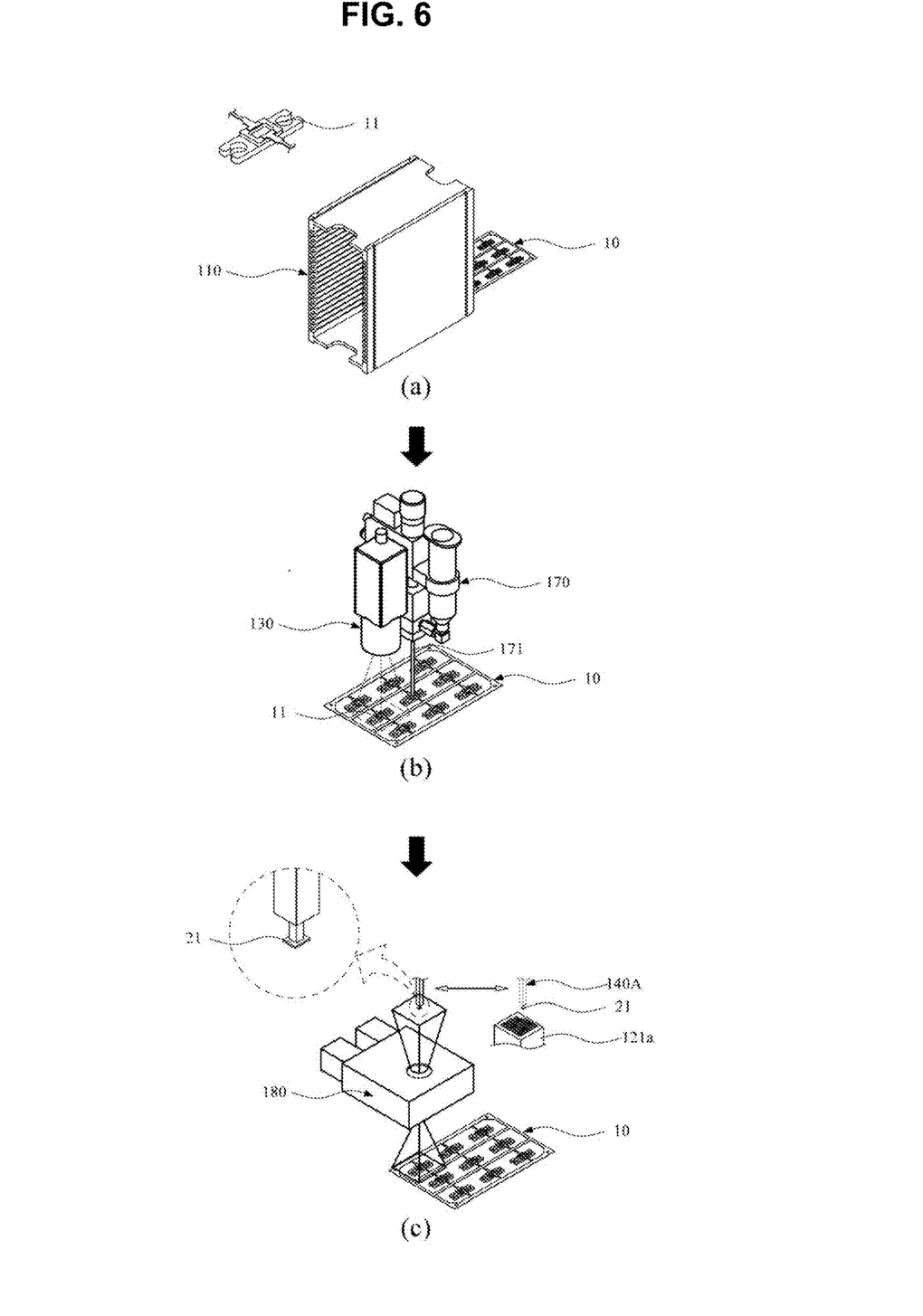
FIGS. 6 through 8 are exploded views illustrating process orders of the apparatus for attaching semiconductor parts of FIG. 5.
Figure 10:
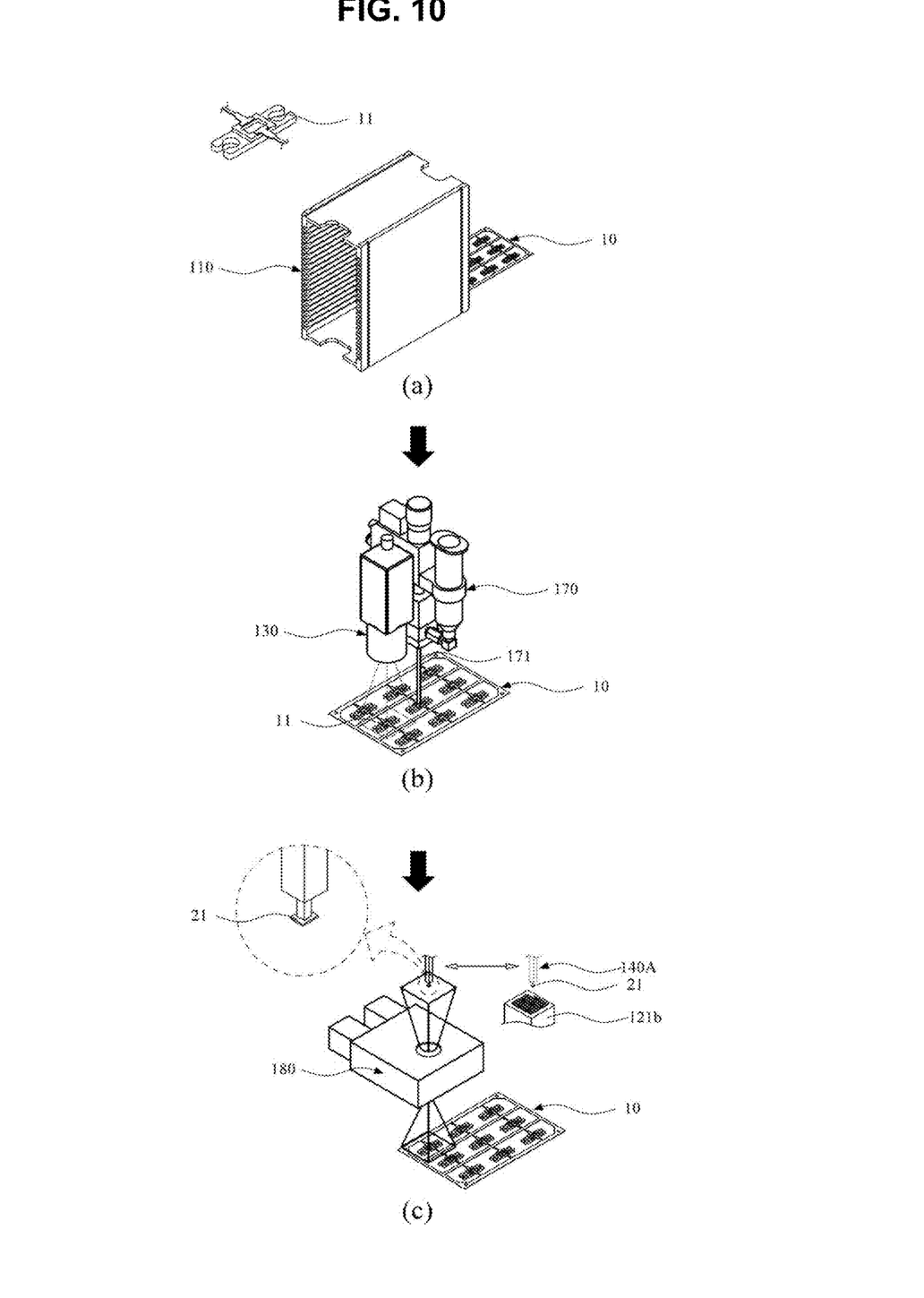
FIGS. 10 through 12 are exploded views illustrating process orders of the apparatus for attaching semiconductor parts of FIG. 9.

Here, the substrate loading unit 110 may be formed as a magazine (refer to FIGS. 3A, 6A, and 10A) to sequentially transfer a plurality of stacked substrates 10 to the first vision examination unit 130, may sequentially transfer the substrates 10 to the first vision examination unit 130 after being placed on a tray, or may sequentially transfer the substrates 10 to the first vision examination unit 130 after being attached to a carrier tape.

Although not illustrated, the magazine may sequentially transfer the substrates 10 by pushing the ends of the substrates 10 using a pusher which slides forward and backward.

Figure 2:
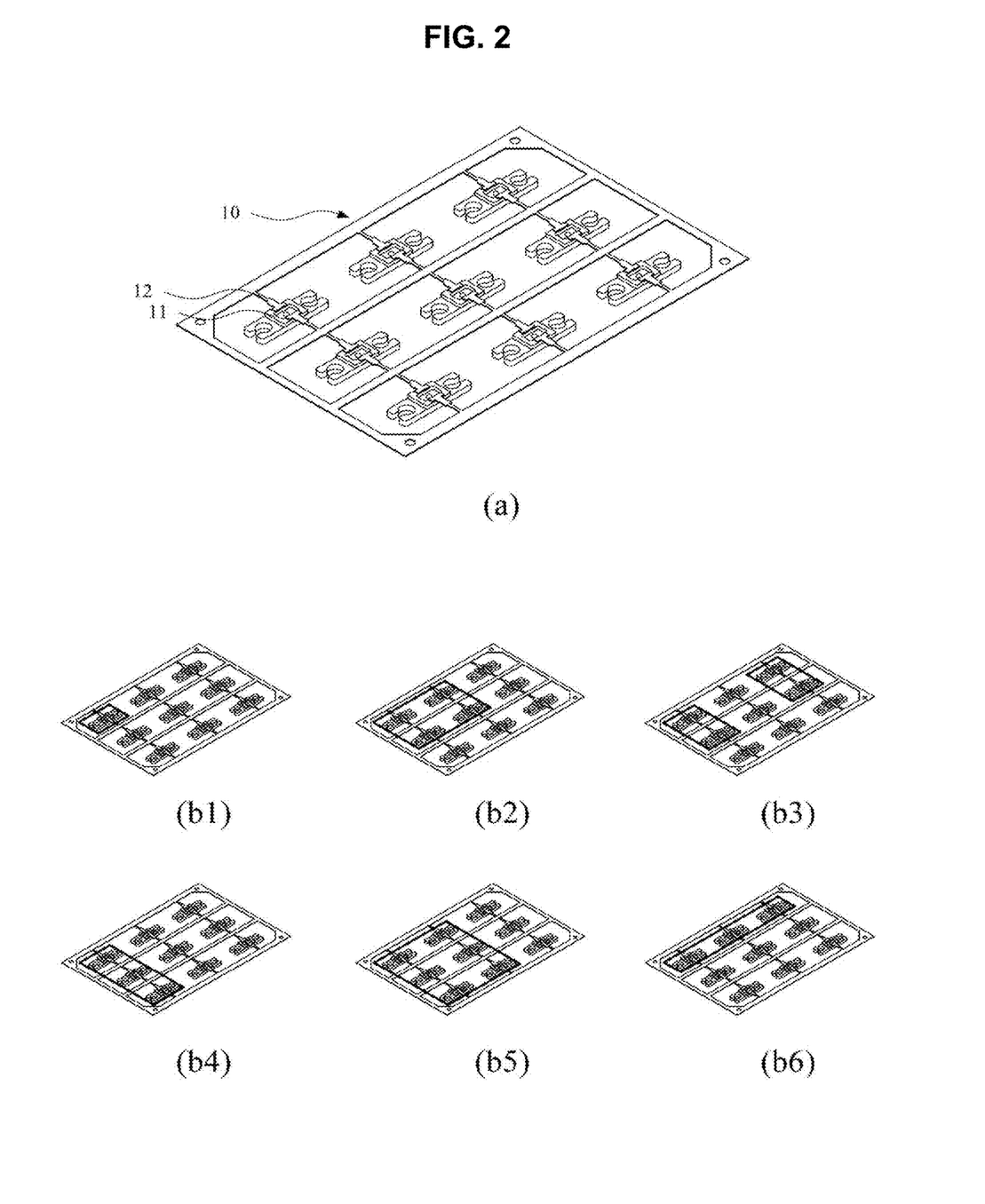
FIG. 2 is an exploded view of a substrate inserted into the apparatus for attaching semiconductor parts of FIG. 1.

As illustrated in FIG. 2A, at least one semiconductor unit 11 may be arranged on the substrate 10 in a matrix form where row and column are each connected by connectors 12.

Also, the substrate 10 may be formed of Cu of above 60%, may include an insulator, and may be a hermetic semiconductor package.

Figure 1:
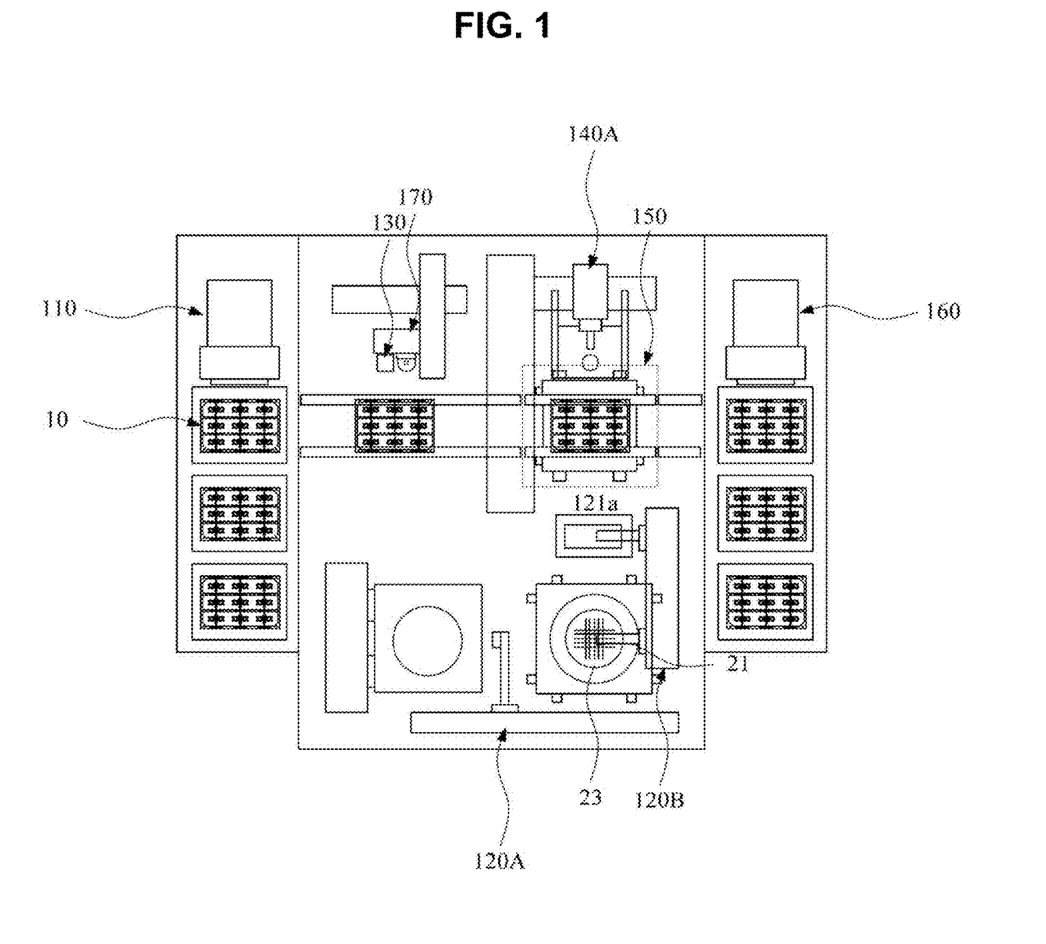
FIG. 1 is a plan view illustrating the whole composition of an apparatus for attaching semiconductor parts according to an embodiment of the present invention.
Figure 5:
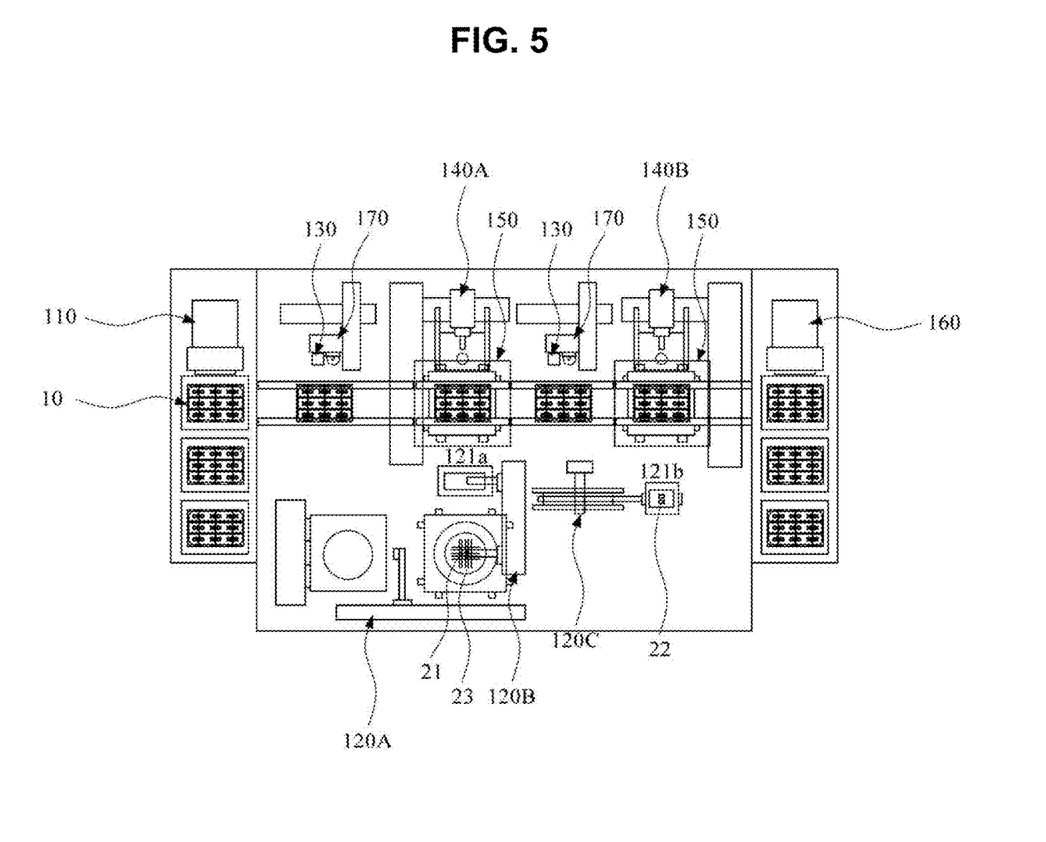
FIG. 5 is a plan view illustrating the whole composition of an apparatus for attaching semiconductor parts according to another embodiment of the present invention.
Figure 9:
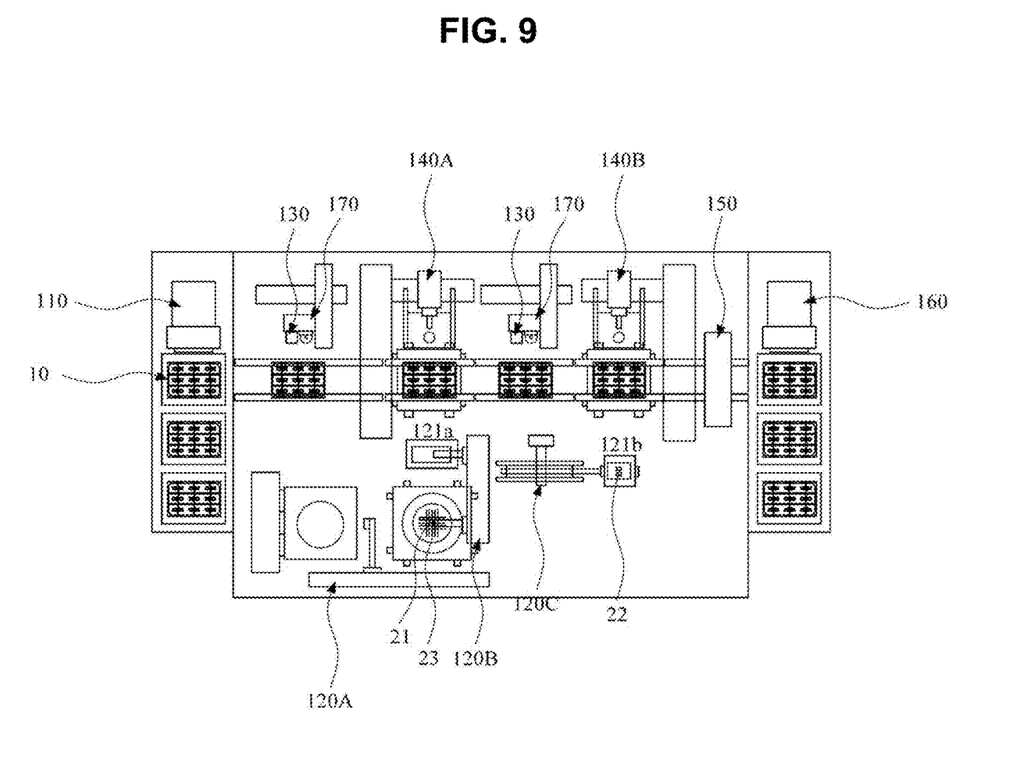
FIG. 9 is a plan view illustrating the whole composition of an apparatus for attaching semiconductor parts according to another embodiment of the present invention.

Next, the at least one semiconductor part loader supplies semiconductor parts of a semiconductor chip 21 or a metal clip 22 and may include a semiconductor chip loader 120B, which picks the semiconductor chip 21 on a wafer 23 transferred by a wafer loader 120A and supplies the picked semiconductor chip 21, and a metal clip loader 120C, which picks and supplies the metal clip 22 electrically connecting to the semiconductor chip 21, as illustrated in FIGS. 1, 5, and 9.

Here, the semiconductor chip 21 may include any one from IGBT, diode, MOSFET, a GaN device, and a SiC device.

The semiconductor part loaders may further include semiconductor part arrangement buffers and the semiconductor part pickers may transfer semiconductor parts, which are transferred from the semiconductor part loaders to the semiconductor part arrangement buffers, to the semiconductor units 11.

For example, in case of the semiconductor chip 21, the semiconductor chip 21 is transferred to the semiconductor chip arrangement buffer 121A from the wafer 21 by the semiconductor chip loader 120B and is arranged. Then, the semiconductor chip 21 is transferred from the semiconductor chip arrangement buffer 121A to the semiconductor units 11 by the semiconductor part picker. In case of the metal clip 22, the metal clip 22 cut from a clip array (not illustrated) is transferred to the metal clip arrangement buffer 121B by the metal clip loader 120C and is arranged. Then, the metal clip 22 may be transferred from the metal clip arrangement buffer 121B to the semiconductor units 11 by the semiconductor part picker.

Next, the first vision examination unit 130 is combined to an XYR axis stage (not illustrated), which is spaced apart from and formed on the upper part of the substrate 10, and examines arrangement states of the semiconductor units 11, adhesive applied positions, and whether to apply adhesives on the substrate 10. For example, the first vision examination unit 130 separately scans the semiconductor units 11 on the substrate 10, examines the arrangement states of the semiconductor units 11 to identify adhesive applied positions, and examines results after adhesives are applied to the semiconductor units 11 by an adhesive applying unit 170.

Here, the adhesives may be previously applied to the semiconductor units 11 of the substrate 10 before a substrate loading process or may be applied for attaching semiconductor parts to the semiconductor units 11 through at least one adhesive applying unit 170 after a substrate loading process.

Then, at least one semiconductor part picker directly transfers the semiconductor parts to the substrate 10 from the wafer 23 so as to mount the semiconductor parts in the semiconductor units 11 or transfers the semiconductor parts from to the substrate 10 from the semiconductor chip arrangement buffer 121A and the metal clip arrangement buffer 121B so as to mount the semiconductor parts in the semiconductor units 11.

For example, the semiconductor part pickers may include a semiconductor chip picker 140A (refer to FIGS. 3C, 6C, and 10C) for picking the semiconductor chip 21 to the semiconductor chip arrangement buffer 121A and a metal clip picker 140B (refer to FIGS. 7F and 11F) for picking the metal clip 22 to the metal clip arrangement buffer 121B.

Here, the semiconductor part pickers supply a heat source at above 60° C. and preheats the picked semiconductor parts so that the adhesive may be rapidly hardened by the adhesive hardening unit 150.

The at least one adhesive hardening unit 150 hardens the adhesives interposed between the semiconductor units 11 and the semiconductor parts of the semiconductor chip 21 and the metal clip 22 using the heat source to attach the adhesives.

The adhesive hardening units 150 restrictively transmit a heat source only to at least one semiconductor unit 11 which is to be hardened so that a temperature difference occurs between the semiconductor units 11, to which a heat source is supplied, and the semiconductor units 11, to which a heat source is not supplied, on the substrate 10 and thereby, properties of a product may be less affected by a heat source transmitted while semiconductor units 11 are hardened.

That is, unlike a general method of simultaneously heating and hardening the whole substrate by using an oven or a reflow furnace and applying heat at the same temperature to all semiconductor parts, only the semiconductor units 11 are restrictively hardened and thereby, property changes occurring due to a heat source may be minimized in semiconductor parts or parts of the substrate, which do not need a heat source.

In addition, the adhesive hardening units 150 may selectively mount the semiconductor parts on the upper part of the adhesive by the semiconductor part picker according to properties of the semiconductor parts and harden the adhesive at the same time. Also, the adhesive hardening units 150 may mount the semiconductor parts on the upper part of the adhesive by the semiconductor part picker and then, harden the adhesive.

For example, the adhesive hardening units 150 may harden the adhesive by using soldering or sintering.

Also, the adhesive hardening units 150 may harden the adhesive by a non-contact method using laser heating or a contact method directly contacting the semiconductor units 11 using a heater 151.

Figure 4:
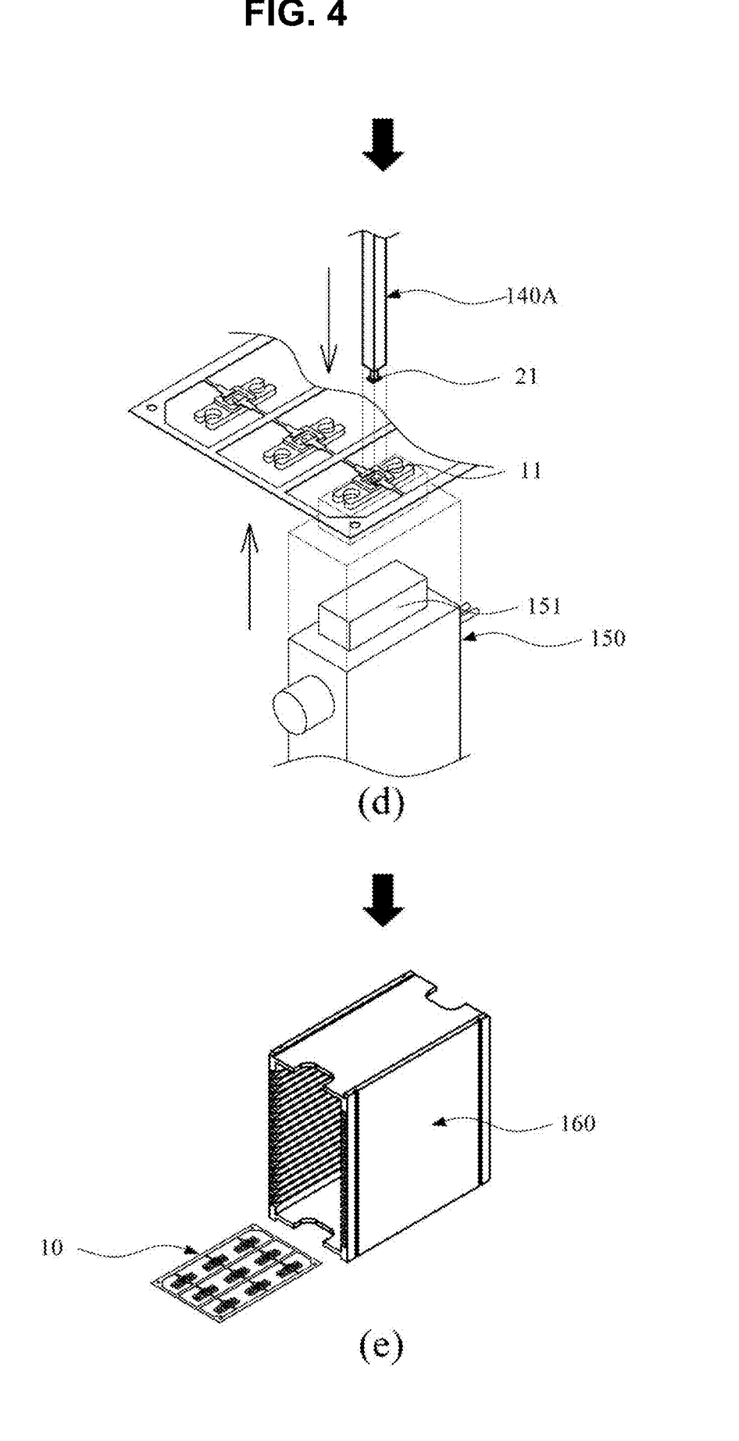

For example, as illustrated in FIG. 4D, the adhesive hardening unit 150 raises the heater 151 to touch the lower part of the semiconductor unit 11 and thereby, hardens the adhesive interposed between the semiconductor unit 11 and the semiconductor chip 21. Accordingly, a separate equipment including the semiconductor part loader, the semiconductor part picker, and the adhesive hardening unit may be formed.

Although not illustrated in the drawings, the adhesive hardening unit 150 may harden the adhesive by an indirect contact to the semiconductor units using hot air. Here, the hot air may have temperature in the range of 50° C. through 450° C. and may include nitrogen or hydrogen of predetermined ratio (%), that is, a fixed ratio.

Figure 7:
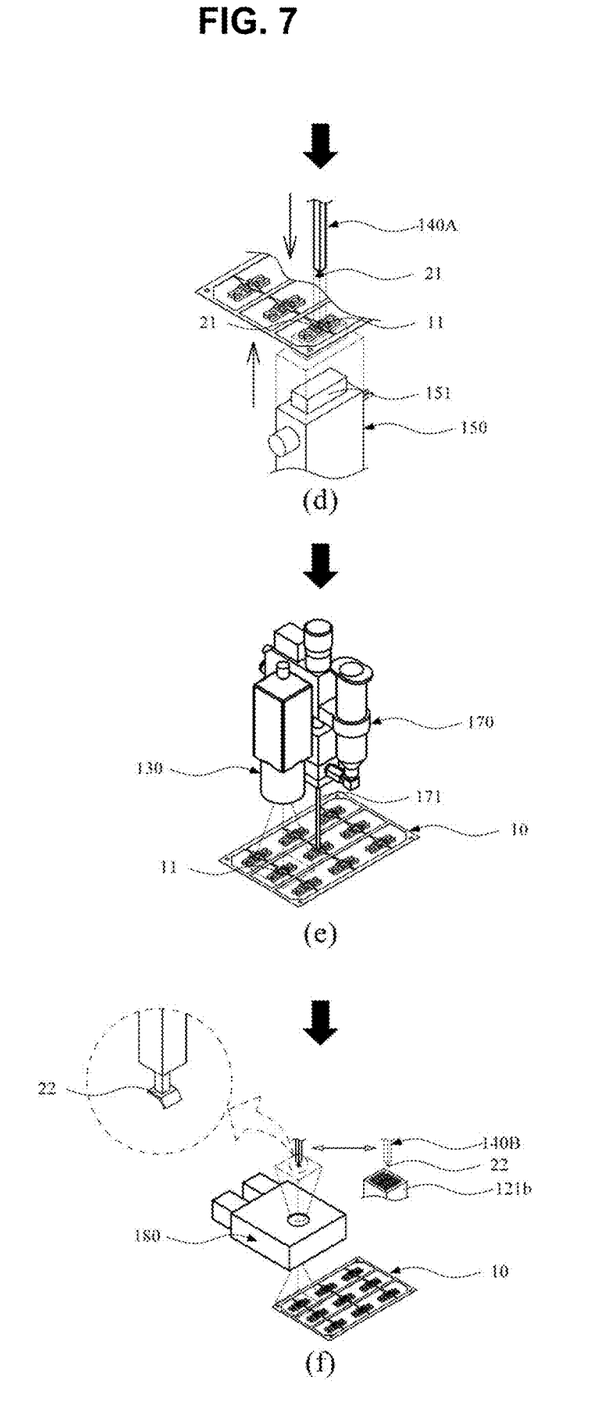
Figure 8:
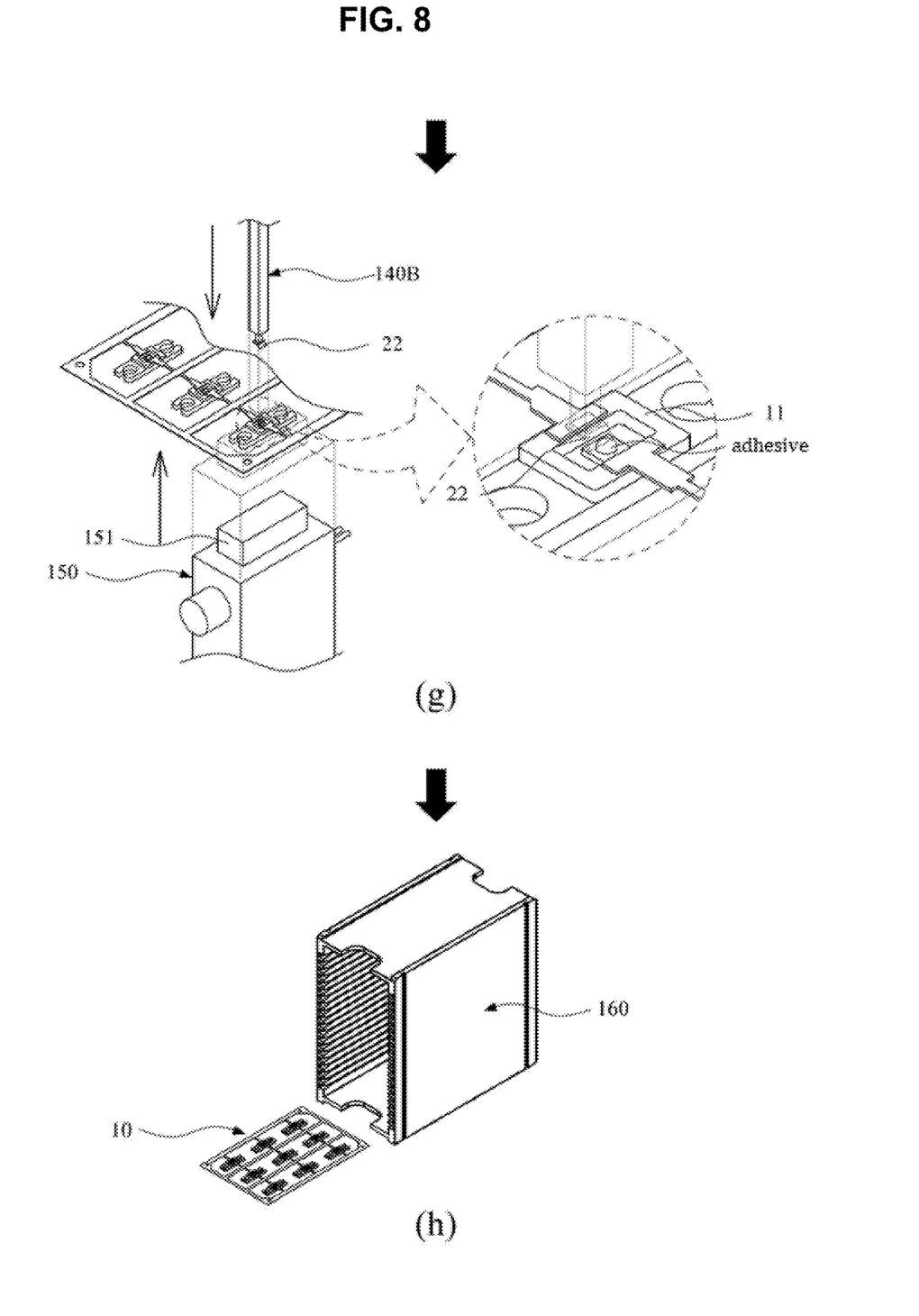

Also, as illustrated in FIG. 7D, the adhesive hardening unit 150 raises the heater 151 to touch the lower part of the semiconductor unit 11 and thereby, hardens the adhesive interposed between the semiconductor unit 11 and the semiconductor chip 21. As illustrated in FIG. 8G, the adhesive hardening unit 150 raises the heater 151 to touch the lower part of the semiconductor unit 11 and thereby, respectively hardens the adhesives interposed between the semiconductor chip 21 and the metal clip 22. Since the adhesives are separately hardened according to each attaching process of the semiconductor chip 21 and the metal clip 22, primary equipment for attaching the semiconductor chip 21 and secondary equipment for attaching the metal clip 22 are in-lined so as to facilitate connection with equipment used in following processes.

That is, when the adhesive is hardened by a general oven, furnace, or reflow, connection with other equipment and in-line are impossible. However, when the adhesives are separately hardened after attaching the semiconductor parts of the semiconductor chip and the metal clip, equipment used in following processes may be continuously in-lined.

Figure 12:
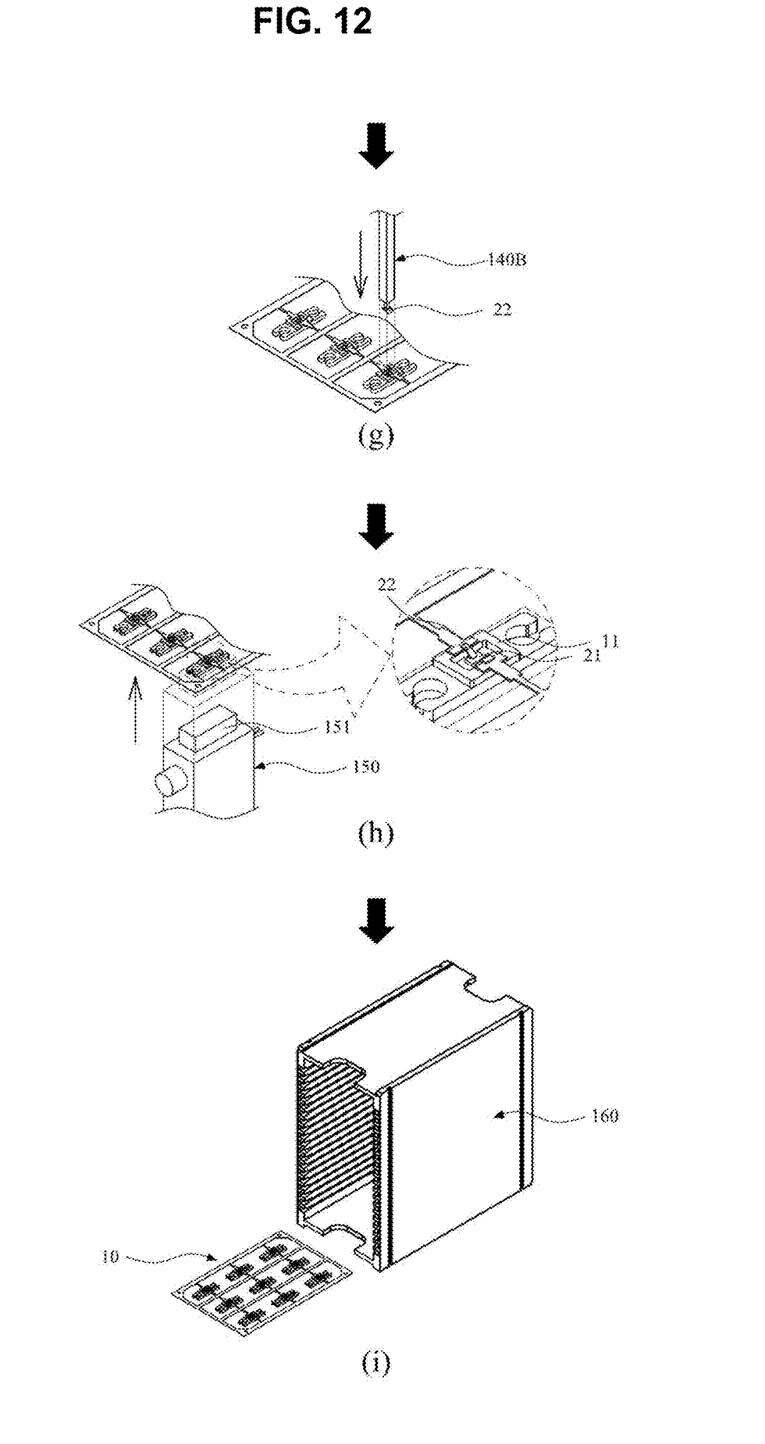

In addition, as illustrated in FIG. 12H, the adhesive hardening unit 150 raises the heater 151 to touch the lower part of the semiconductor unit 11 and thereby, simultaneously hardens the adhesives interposed between the semiconductor unit 11 and the semiconductor chip 21 and between the semiconductor chip 21 and the metal clip 22. Accordingly, the adhesives may be hardened at once after attaching the metal clip 22.

Here, the primary equipment for attaching the semiconductor chip and the secondary equipment for attaching the metal clip are described. However, the present invention is not limited thereto and Nth equipment for attaching other semiconductor parts may be continuously in-lined.

The adhesive hardening unit 150 may harden the substrate 10 by using various methods. For example, as illustrated in FIG. 2B1, the adhesive hardening unit 150 may sequentially harden the adhesives of each semiconductor unit 11 on the substrate 10, as illustrated in FIG. 2B2, the adhesive hardening unit 150 may sequentially harden the adhesives of each semiconductor unit block including at least two semiconductor units 11 on the substrate 10, as illustrated in FIG. 2B3, the adhesive hardening unit 150 may sequentially harden the adhesives of each of the at least two semiconductor unit block on the substrate 10, or as illustrated in FIGS. 2B4, 2B5, and 2B6, the adhesive hardening unit 150 may sequentially harden the adhesives according to each group of the semiconductor units 11 grouped and arranged by at least one row and column on the substrate 10.

Next, the substrate unloading unit 160 releases the substrate 10, on which the semiconductor parts hardened by the adhesive are mounted in the semiconductor units 11, and provides the substrate 10 to following processes.

The adhesive applying unit 170 provides the adhesives to the semiconductor units 11 by dotting using a needle 171 (refer to FIG. 3B) or by spraying using a spray nozzle (not illustrated) from the upper part of the semiconductor units 11.

Here, the adhesive may be a solder alloy or a sinter material including Ag or Cu, wherein the solder alloy may include Au or Sn mixed in a predetermined ratio.

Also, the solder alloy is in a paste form where a size of solder particles included therein may be 25 µm or below.

As described above, a separate equipment including the semiconductor part loader, the semiconductor part picker, and the adhesive hardening unit may be formed to perform processes of attaching the semiconductor parts. As illustrated in FIGS. 3 and 4, a process A of providing the substrate 10 by the substrate loading unit 110, a process B of coating the semiconductor units 11 with the adhesives using the adhesive applying unit 170, a process C of mounting the semiconductor chip 21, which is the semiconductor part, in the semiconductor units 11 by using the semiconductor chip picker 140A, which is the semiconductor part picker, a process D of hardening the adhesives by using the adhesive hardening unit 150, and a process E of releasing the substrate 10, on which the semiconductor parts are attached to the semiconductor units 11, by using the substrate unloading unit 160 may be performed to attach the semiconductor parts.

In addition, the primary equipment for attaching the semiconductor chip and the secondary equipment for attaching the metal clip may be in-lined to perform processes of attaching the semiconductor parts. As illustrated in FIGS. 6 through 8, a process A of providing the substrate 10 by the substrate loading unit 110, a process B of coating the semiconductor units 11 with the adhesives using the adhesive applying unit 170, a process C of mounting the semiconductor chip 21, which is the first semiconductor part, in the semiconductor units 11 by using the semiconductor chip picker 140A, which is the semiconductor part picker, a process D of firstly hardening the adhesives by using the adhesive hardening unit 150 and attaching the semiconductor chip 21 to the semiconductor units 11, a process E of coating the first semiconductor part with the adhesive by using the adhesive applying unit 170, a process F of mounting the metal clip 22, which is the second semiconductor part, in the semiconductor units 11 by using the metal clip picker 140B, which is the semiconductor part picker, a process G of secondly hardening the adhesives by using the adhesive hardening unit 150 and attaching the metal clip 22 to the semiconductor chip 21, and a process H of releasing the substrate 10, on which the first and second semiconductor parts are stacked and attached to the semiconductor units 11, by using the substrate unloading unit 160 may be performed to attach the semiconductor parts.

Figure 11:
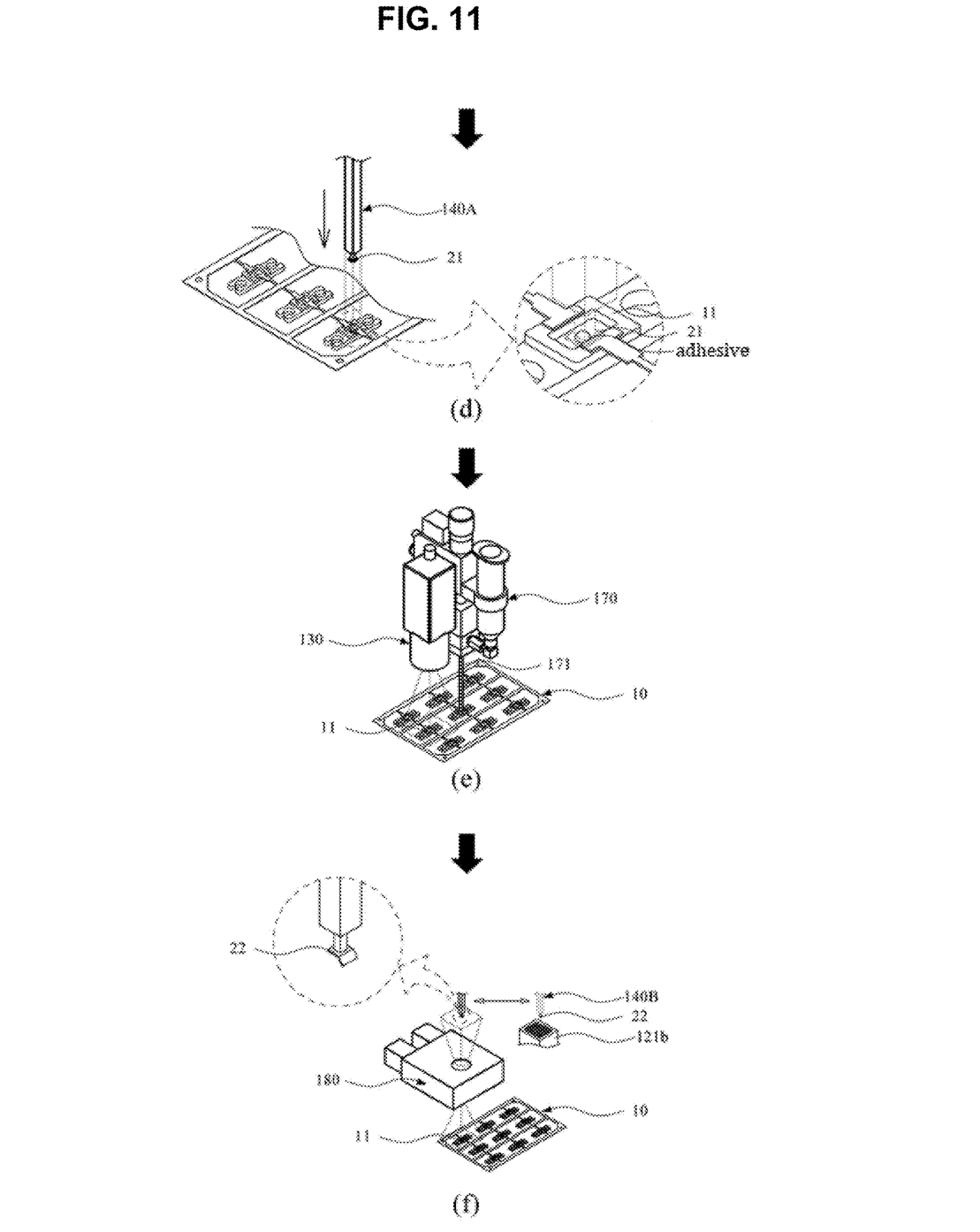

Moreover, the adhesives respectively interposed between the semiconductor units 11 and the semiconductor chip 21 and between the semiconductor chip 21 and the metal clip 22 may be simultaneously hardened to perform processes of attaching the semiconductor parts. As illustrated in FIGS. 10 through 12, a process A of providing the substrate 10 by the substrate loading unit 110, a process B of coating the semiconductor units 11 with the adhesives using the adhesive applying unit 170, processes C and D of mounting the semiconductor chip 21, which is the first semiconductor part, in the semiconductor units 11 by using the semiconductor chip picker 140A, which is the semiconductor part picker, a process E of coating the first semiconductor part with the adhesive by using the adhesive applying unit 170, processes F and G of mounting the metal clip 22, which is the second semiconductor part, in the semiconductor units 11 by using the metal clip picker 140B, which is the semiconductor part picker, a process H of hardening the adhesives by using the adhesive hardening unit 150, and a process I of releasing the substrate 10, on which the first and second semiconductor parts are stacked and attached to the semiconductor units 11, by using the substrate unloading unit 160 may be performed to attach the semiconductor parts.

As illustrated in FIGS. 3C, 6C, 7F, 10C, and 11F, a second vision examination unit 180 may be further included to examine attachment positions of the semiconductor parts in the semiconductor units 11 and may be formed of a top/bottom align vision camera respectively examining the arrangement of the semiconductor chip 21 by the semiconductor chip picker 140A and the metal clip 22 by the metal clip picker 140B upwards and respectively examining the mount positions of the semiconductor chip 21 and the metal clip 22 on the semiconductor units 11 downwards.

Also, a plasma cleaning unit (not illustrated) may be further included to plasma clean the substrate 10, on which the semiconductor parts are hardened by the adhesives and mounted in the semiconductor units 11, so as to vaporize and remove impurities adhered to the semiconductor chip 21 or the metal clip 22 and then, may transfer the substrate 10 to the substrate unloading unit 160.

According to the apparatus for attaching semiconductor parts described above, unlike a general method of simultaneously heating and hardening the whole substrate by using an oven or a reflow furnace and applying heat at the same temperature to all semiconductor parts, a heat source is restrictively transmitted only to at least one semiconductor unit, which is to be hardened, so that a temperature difference occurs between the semiconductor units, to which a heat source is supplied, and the semiconductor units, to which a heat source is not supplied, on the substrate and thereby, properties of a product may be less affected by a heat source transmitted while semiconductor units are hardened. Also, the adhesives are separately hardened according to each process of attaching the semiconductor parts and related equipment is in-lined to facilitate connection with other equipment used in following processes.

According to the present invention, unlike a general method of simultaneously heating and hardening the whole substrate by using an oven or a reflow furnace and applying heat at the same temperature to all semiconductor parts, a heat source is restrictively transmitted only to at least one semiconductor unit, which is to be hardened, so that a temperature difference occurs between the semiconductor units, to which a heat source is supplied, and the semiconductor units, to which a heat source is not supplied, on the substrate and thereby, properties of a product may be less affected by a heat source transmitted while semiconductor units are hardened.

In addition, the adhesives are separately hardened according to each process of attaching the semiconductor parts and related equipment is in-lined to facilitate connection with other equipment used in following processes. Therefore, equipment operation efficiency may be improved.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An apparatus for attaching semiconductor parts for performing electrical connection of a semiconductor package, the apparatus comprising:
    a substrate loading unit for supplying a substrate, on which at least one semiconductor unit used to manufacture at least one semiconductor package, is arranged;
    at least one semiconductor part loader for supplying semiconductor parts;
    a first vision examination unit for examining any one of arrangement states of the semiconductor units, adhesive applied positions, and whether to apply adhesives on the substrate;
    at least one semiconductor part picker for transferring the semiconductor parts to the substrate and mounting the transferred semiconductor parts in the semiconductor units;
    at least one adhesive hardening unit for hardening and attaching adhesives interposed between the semiconductor units and the semiconductor parts;
    a substrate unloading unit for releasing the substrate on which the semiconductor parts are hardened by the adhesives and mounted in the semiconductor units; and
    at least one vertically moveable heater, wherein the at least one adhesive hardening unit raises the heater to harden the adhesives,
    wherein the adhesive hardening unit restrictively transmits a heat source only to at least one semiconductor unit, which is to be hardened, so that a temperature difference occurs between the semiconductor units, to which the heat source is supplied, and the semiconductor units, to which the heat source is not supplied, on the substrate,
    wherein the heater is in direct contact with a lower part of the at least one semiconductor unit when the heater is raised by the adhesive hardening unit.

2. The apparatus of claim 1, further comprising at least one adhesive applying unit for supplying the adhesives used to attach the semiconductor parts to the semiconductor units.

3. The apparatus of claim 2, wherein the adhesive applying unit supplies the adhesives to the semiconductor units by dotting using a needle or by spraying from the upper parts of the semiconductor units.

4. The apparatus of claim 3, wherein the adhesives are solder alloys or sinter materials comprising Ag or Cu.

5. The apparatus of claim 1, wherein the substrate comprises Cu of 60% or an insulator.

6. The apparatus of claim 1, wherein the semiconductor part loader supplies a semiconductor chip or a metal clip for electrically connecting to the semiconductor chip.

7. The apparatus of claim 1, wherein the adhesive hardening unit mounts the semiconductor parts on the upper parts of the adhesives by the semiconductor part pickers and hardens the adhesives at the same time or the adhesive hardening unit mounts the semiconductor parts on the upper parts of the adhesives by the semiconductor part picker and then, hardens the adhesives.

8. The apparatus of claim 7, wherein the adhesive hardening unit sequentially hardens the adhesives of each semiconductor unit on the substrate.

9. The apparatus of claim 7, wherein the adhesive hardening unit sequentially hardens the adhesives of each semiconductor unit block comprising at least two semiconductor units on the substrate.

10. The apparatus of claim 9, wherein the adhesive hardening unit sequentially hardens the adhesives of each of the at least two semiconductor unit blocks.

11. The apparatus of claim 7, wherein the adhesive hardening unit sequentially hardens the adhesives of each group of the semiconductor units grouped and arranged by at least one row and column on the substrate.

12. The apparatus of claim 1, wherein the at least one semiconductor part picker mounts the semiconductor parts and the at least one adhesive hardening unit raises the heater at the same time.

13. The apparatus of claim 1, wherein the semiconductor parts are attached by providing the substrate by the substrate loading unit, mounting the semiconductor parts in the semiconductor units by using the semiconductor part picker, hardening the adhesives interposed between the semiconductor units and the semiconductor parts by using the adhesive hardening unit, and releasing the substrate, on which the semiconductor parts are attached to the semiconductor units, by using the substrate unloading unit.

14. The apparatus of claim 1, wherein the semiconductor parts are attached by providing the substrate by the substrate loading unit, mounting first semiconductor parts in the semiconductor units by using the semiconductor part picker, mounting second semiconductor parts in the semiconductor units by using the semiconductor part picker, hardening the adhesives interposed between the semiconductor units and the first semiconductor parts and between the first semiconductor parts and the second semiconductor parts by using the adhesive hardening unit, and releasing the substrate, on which the first and second semiconductor parts are stacked and attached to the semiconductor units, by using the substrate unloading unit.

15. The apparatus of claim 1, wherein the semiconductor parts are attached by providing the substrate by the substrate loading unit, mounting first semiconductor parts in the semiconductor units by using the semiconductor part picker, firstly hardening the adhesives interposed between the semiconductor units and the first semiconductor parts by using the adhesive hardening unit, mounting second semiconductor parts in the semiconductor units by using the semiconductor part picker, secondly hardening the adhesives interposed between the first semiconductor parts and the second semiconductor parts by using the adhesive hardening unit, and releasing the substrate, on which the first and second semiconductor parts are stacked and attached to the semiconductor units, by using the substrate unloading unit.

16. The apparatus of claim 1, wherein the semiconductor part loader further comprises semiconductor parts arrangement buffers, and the semiconductor part picker transfers the semiconductor parts, which are transferred from the semiconductor part loader to the semiconductor parts arrangement buffers, to the semiconductor units.

17. The apparatus of claim 1, further comprising a second vision examination unit for examining attachment positions of the semiconductor parts in the semiconductor units.

18. The apparatus of claim 1, further comprising a plasma cleaning unit for plasma cleaning the substrate, on which the semiconductor parts are hardened by the adhesives and mounted in the semiconductor units, and transferring the substrate to the substrate unloading unit.

* * * * *